United States Patent
Brennan

[19]

[11] Patent Number: 5,998,297
[45] Date of Patent: Dec. 7, 1999

[54] METHOD OF ETCHING COPPER OR COPPER-DOPED ALUMINUM

[75] Inventor: Kenneth D. Brennan, Flower Mound, Tex.

[73] Assignee: Texas Instruments Incorporated, Dallas, Tex.

[21] Appl. No.: 08/947,489

[22] Filed: Oct. 10, 1997

Related U.S. Application Data

[60] Provisional application No. 60/028,607, Oct. 23, 1996.

[51] Int. Cl.$^6$ .................................................. H01L 21/44
[52] U.S. Cl. ......................... 438/687; 438/688; 438/720; 438/754; 216/2; 216/13; 216/67; 216/77; 216/78; 216/66
[58] Field of Search ..................................... 438/687, 688, 438/720, 754, FOR 109; 216/2, 13, 67, 77, 78, 66

[56] References Cited

U.S. PATENT DOCUMENTS

| | | | |
|---|---|---|---|
| 4,468,284 | 8/1984 | Nelson | 156/643 |
| 4,919,750 | 4/1990 | Bausmith | 156/643 |

FOREIGN PATENT DOCUMENTS

| | | |
|---|---|---|
| 04180580 | 6/1992 | European Pat. Off. . |
| 04208526 | 7/1992 | European Pat. Off. . |
| 06177084 | 6/1994 | European Pat. Off. . |

OTHER PUBLICATIONS

Sato, et al., "Al–Cu Alloy Etching Using In–Reactor Aluminum Chloride Formation in Statci Mandetron Triode Reactive Ion Etching," Jpn. J. Appl. Phys., vol. 32(1993), pp. 3013–3018.

Narasimhan et al., "Aluminum–4% Cu Interconnect Etching in a Low–Pressure Magnetically Enhanced Reactor", vol. 10, No. 4, Jul./Aug. 1992, pp. 1100–1105.

Sato et al., "Al–Cu Alloy Etching Using In–reactor Aluminum Chloride Formation in Static Magnetron Triode Reactive Ion Etching", Jpn. J. Appl. Phys. vol. 32 Pt. 1, No. 6B, 1993, pp. 3013–3018.

F. P. Emmenegger, "Stability of Gaseous Complexes between Two–and Three–Valent Metal Halides", Inorganic Chemistry, vol. 16, No. 2, 1977, pp. 343–348.

*Primary Examiner*—John F. Niebling
*Assistant Examiner*—David A. Zarneke
*Attorney, Agent, or Firm*—Mark A. Valetti; W. James Brady; Richard L. Donaldson

[57] ABSTRACT

An embodiment of the instant invention is a method of etching a conductive structure comprised of copper and overlying a semiconductor substrate, the method comprising the step of: subjecting the conductive structure to a combination of plasma, an etchant, and a gaseous aluminum source. Preferably, the conductive structure is comprised of aluminum and copper (more preferably, it is comprised of aluminum and 1 to 4% by weight copper) or it may be substantially comprised of substantially pure copper. In addition, the etchant is preferably introduced into the process chamber in a gaseous state and is comprised of $Cl_2$. The gaseous aluminum source may be comprised of: DMAH, trimethylaluminum, dimethylalane, trimethylaminealine, dimethylethylaminealane, dimethylethylaminedimethylalane, or $AlCl_3$.

11 Claims, 1 Drawing Sheet

METHOD OF ETCHING COPPER OR COPPER-DOPED ALUMINUM

This application claims priority under 35 USC § 119(e)(1) of provisional application Ser. No. 60/028,607, filed Oct. 23, 1996.

CROSS-REFERENCE TO RELATED PATENT/ PATENT APPLICATIONS

The following commonly assigned patent/patent applications are hereby incorporated herein by reference:

| Pat. No. /Ser. No. | Filing Date | TI Case No. |
| --- | --- | --- |
| 09/038,247 | 03/11/1998 | TI-22952 |

FIELD OF THE INVENTION

The instant invention pertains to semiconductor device fabrication and processing and more specifically to a method of etching copper or copper-doped aluminum structures.

BACKGROUND OF THE INVENTION

Interconnects for future generations of integrated microcircuits need to be both highly conductive and electromigration resistant. Copper doping of aluminum interconnects significantly improves electromigration resistance due to the precipitation of $CuAl_2$, or a sub-stoichiometric alloy along the grain boundaries. These grain boundary precipitates retard grain boundary diffusion in the thin films, thereby reducing total mass transport and improving electromigration resistance. The $CuAl_2$ precipitates at grain boundaries and triple points are formed after annealing Al—Cu films at 425° C. Similarly Al—Cu thin films annealed at 200 to 300° C. are enriched with copper at the aluminum grain boundaries.

Copper doping can be achieved by sputtering an Al—Cu film or by annealing a sandwiched stack of Al and a pure Cu or Cu containing film. In situ sputtered copper-containing films have been used as copper doping sources for chemical vapor deposited (CVD) aluminum at temperatures as low as 230° C. Diffusion of copper from the copper containing film can result in a copper concentration in the CVD Al approaching solid solubility limits. From a sputtered pure copper source a maximum of 3.7 wt % of copper is incorporated into the aluminum film. The copper containing film may also be deposited using metal-organic CVD (MOCVD) precursors. A small amount of copper diffuses into the aluminum layer during deposition, and complete diffusion of the copper into the aluminum is achieved by a rapid thermal anneal at a higher temperature.

Typically, electromigration characteristics improve with increasing copper doping in the range of zero to two weight percent. However Al—Cu alloys with copper levels above one percent by weight are difficult to etch. This is due to the fact that copper byproducts formed during the etch have extremely low vapor pressure and form residues during the etch. These residues can make the etched surface rough as well as result in micromasking and uneven etching. In addition, the residue can short adjacent metal lines, thereby causing defects.

It is, therefore, an object of the instant invention to provide a method of etching copper-doped aluminum films. It is another object of the instant invention to provide a method for etching pure copper films.

SUMMARY OF THE INVENTION

One embodiment of the instant invention is a method of fabricating an electrical device on a semiconductor substrate, the method comprising the steps of: forming a metal layer over the substrate, the metal layer comprised of copper; and etching the metal layer by subjecting it to a combination of plasma, a gaseous etchant, and a gaseous aluminum source. Preferably, the metal layer is comprised of aluminum and copper (more preferably it is comprised of aluminum and 1 to 4% by weight copper) or it is substantially comprised substantially pure copper. The etchant is preferably introduced into the process chamber in a gaseous state and is comprised of $Cl_2$. The gaseous aluminum source may be is comprised of: DMAH, trimethylaluminum, dimethylalane, trimethylaminealine, dimethylethylaminealane, dimethylethylaminedimethylalane, or $AlCl_3$.

Another embodiment of the instant invention is a method of etching a conductive structure comprised of copper and overlying a semiconductor substrate, the method comprising the step of: subjecting the conductive structure to a combination of plasma, an etchant, and a gaseous aluminum source. Preferably, the conductive structure is comprised of aluminum and copper (more preferably, it is comprised of aluminum and 1 to 4% by weight copper) or it may be substantially comprised of substantially pure copper. In addition, the etchant is preferably introduced into the process chamber in a gaseous state and is comprised of $Cl_2$. The gaseous aluminum source may be comprised of: DMAH, trimethylaluminum, dimethylalane, trimethylaminealine, dimethylethylaminealane, dimethylethylaminedimethylalane, or $AlCl_3$.

BRIEF DESCRIPTION OF THE DRAWINGS

FIGS. 1a–1c illustrate the method of one embodiment of the instant invention.

DETAILED DESCRIPTION OF THE DRAWINGS

Figure 1A:
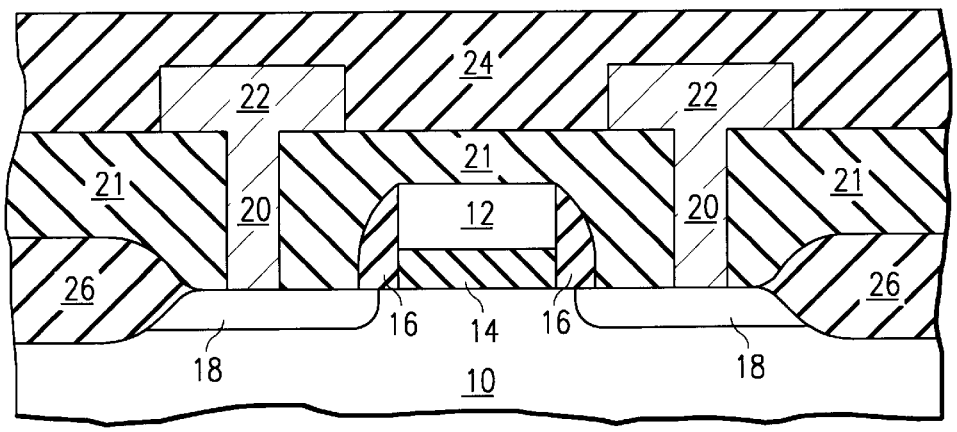
FIGS. 1a–1c are cross-sectional views of a portion of a semiconductor device fabrication process.

One embodiment of the instant invention is a method of etching copper films or copper-doped aluminum films. Preferably, this embodiment of the instant invention is comprised of placing a semiconductor wafer which includes the copper-doped aluminum/copper film which is to be patterned and etched, and performing this etch step by subjecting the wafer to a chlorine gas source, an aluminum gas source, and plasma. The chlorine gas source could be: $Cl_2$. The aluminum source, which is preferably introduced as a gas, may be comprised of: an aluminum CVD precursor (dimethylaluminum hydride (DMAH), trimethylaluminum, dimethylalane, trimethylaminealine, dimethylethylaminealane, or dimethylethylaminedimethylalane) or an inorganic aluminum source ($AlCl_3$). If $AlCl_3$ is utilized in a solid form, then it should be heated so as to sublime it, and the $AlCl_3$ in vapor phase would then be used as an aluminum-containing gas source. Preferably, the ambient temperature of the process chamber at the electrode (the wafer position) is preferably less than 80° C. and the ambient pressure is preferably around 5 to 20 mTorr. Depending on the percentage of copper in the film (anywhere from 0.5 to 4% copper in an aluminum film to a relatively pure copper film) and the thickness of the film, the etch rate of a copper doped aluminum film is around 7500 Å/min, whereas the etch rate of a copper film is around 5000 Å/min.

Copper-rich precipitates in Al—Cu alloy thin films are difficult to etch at low temperature, say, less than 80° C. Various copper chlorides, the etch products of a typical copper etch, are not volatile at low temperatures. In one embodiment of the instant invention, a source of aluminum is added to the gas feed, the etch reactants, which causes the formation of $Al_2CuCl_8$ during the plasma etch process. This Al—Cu chloride complex is volatile at low temperatures. Therefore, addition of a gaseous source of aluminum, as taught by the instant invention, to the feed gases results in the etching of the copper-rich precipitates in Al—Cu thin films, where the copper is anywhere from 0 to 100% by weight (preferably between 1 to 4% by weight).

Another embodiment of the instant invention is a pure copper etching method. In this method, $Cl_2$ and an aluminum-containing gas source are provided into the plasma etch chamber so as to form $Al_2CuCl_8$. In this embodiment the same operating regime and the same etch products, volatile Al—Cu chloride complexes, as the Al—Cu etch of the aforementioned embodiment can be used to etch pure copper thin films.

Volatile Fe—Cu chloride complexes and volatile Al—Cu or Fe—Cu bromides may be substituted for Al—Cu chlorides to etch pure copper or Al—x %Cu thin films (i.e. x % of Cu by weight in Al). In each of the embodiments of the instant invention, the central idea is to feed a gaseous source of Al, or possibly Fe, and a source of chlorine, or possibly bromine, into a plasma reactor to etch either pure copper or copper-rich precipitates.

It is important that the gaseous aluminum source is provided during the etching of the copper-doped aluminum/copper film because it enhances the etching of the film. In addition, it is important that the source be in a gaseous state because it is easier to introduce into the chamber and easier to evacuate from the chamber. During the evacuation of the chamber, the gaseous chlorine and the gaseous aluminum sources are evacuated.

Figure 1B:
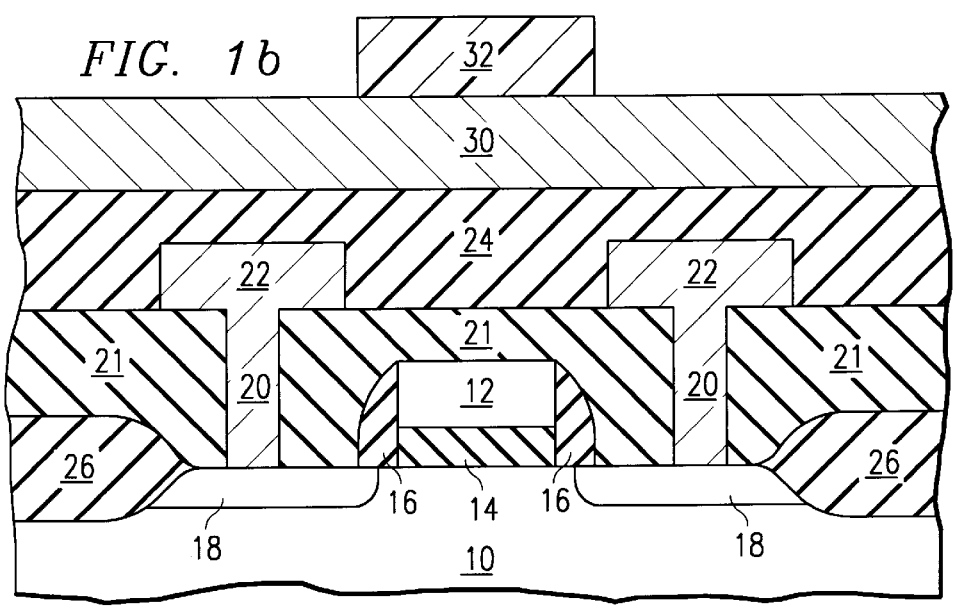
Figure 1C:
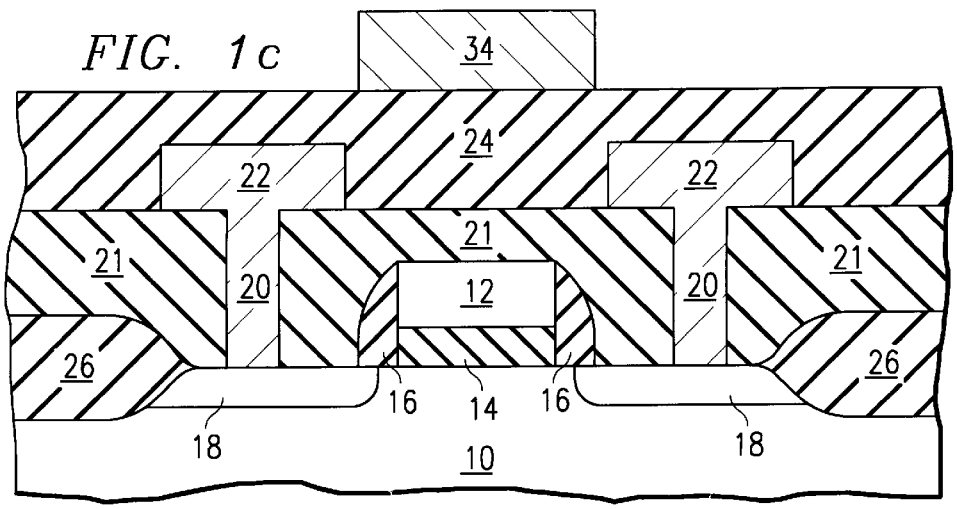

Referring to FIGS. 1a–1c, substrate 10 is provided with a transistor formed in and on substrate 10. The transistor includes source/drain regions 18, gate insulator 14, conductive gate structure 12, sidewall insulators 16 and field insulator regions 26. Please note, though, that while this embodiment is described in reference to this figure, the embodiments of the instant invention can be utilized in the formation of any device which requires patterned metal structures which include copper. Please also note that while FIGS. 1a–1c specifically show certain features, others can be used instead. For example, one of skill in this art would know that field insulating regions 26 can be replaced by trench isolation regions and that contacts 20 may or may not be formed along with metal lines 22.

Dielectric layer 21 is formed over the transistor. Dielectric layer 21 may be formed of HSQ, a glass (BPSG or PSG), a low-k dielectric (such as an aerogel, zerogel, or a polymer) or any other insulating layer. Contacts 20 are formed such that they extend from conductive structures 22, through dielectric layer 21, to source/drain regions 18. Preferably, contact 20 and conductive structure 22 are formed of the same material and formed at the same time. This can be done, for example, by using a ForceFill™ process to form an aluminum film which preferably contains 1 to 4% copper (by weight), and then patterning/etching this layer with the embodiment of the instant invention so as to form structures 22.

Dielectric layer 24 is formed over structures 22 and dielectric layer 21. Preferably, dielectric layer 24 is formed of HSQ, a glass (BPSG or PSG), or a low-k material. Metal layer 30 is formed on dielectric 24. Metal layer 30 is preferably comprised of aluminum and copper (preferably 1 to 4% of copper by weight, but may be much more or less copper). This can be accomplished by forming an aluminum/copper/aluminum stack or by forming the aluminum layer with copper included in the layer. Layer 30 may be subjected to a heating step prior to the patterning/etching of layer 30 (so as to incorporate the copper into the aluminum), and/or it may be subjecting to a heating step after the etching of layer 30.

Conductive structure 34 is preferably comprised of Cu or Al—Cu. Preferably, conductive structure 34 is patterned/etched by subjecting it to the combination of plasma, etchant, and a gaseous aluminum source of the instant invention.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. In a method of fabricating an electrical device on a semiconductor substrate, said method comprising the steps of:

forming a metal layer over said substrate, said metal layer comprised of copper;

etching said metal layer by subjecting it to a combination of plasma, a gaseous etchant, and a gaseous aluminum source;

and wherein said gaseous aluminum source is comprised of a compound selected from the group consisting of: DMAH, trimethylaluminum, dimethylalane, trimethylaminealine, dimethylethylaminealane, and dimethylethylaminedimethylalane.

2. The method of claim 1, wherein said metal layer is comprised of aluminum and copper.

3. The method of claim 2, wherein said metal layer is comprised of aluminum and 1 to 4% by weight copper.

4. The method of claim 1, wherein said metal layer is comprised pure copper.

5. The method of claim 1, wherein said gaseous etchant is comprised of $Cl_2$.

6. A method of etching a conductive structure comprised of copper and overlying a semiconductor substrate, said method comprising the step of: subjecting said conductive structure to a combination of plasma, an etchant, and a gaseous aluminum source;

and wherein said gaseous aluminum source is comprised of a compound selected from the group consisting of: DMAH, trimethylaluminum, dimethylalane, trimethylaminealine, dimethylethylaminealane, and dimethylethylaminedimethylalane.

7. The method of claim 6, wherein said conductive structure is comprised of aluminum and copper.

8. The method of claim 7, wherein said conductive structure is comprised of aluminum and 1 to 4% by weight copper.

9. The method of claim 6, wherein said conductive structure is comprised pure copper.

10. The method of claim 6, wherein said etchant is in a gaseous state.

11. The method of claim 6, wherein said etchant is comprised of $Cl_2$.

* * * * *